United States Patent
Li

(10) Patent No.: US 8,710,531 B2
(45) Date of Patent: Apr. 29, 2014

(54) LIGHT-EMITTING DIODE DEVICES

(75) Inventor: Syue-Min Li, Taipei (TW)

(73) Assignee: Syue-Min Li, Taipei (TW)

( * ) Notice: Subject to any disclaimer, the term of this patent is extended or adjusted under 35 U.S.C. 154(b) by 0 days.

(21) Appl. No.: 13/600,440

(22) Filed: Aug. 31, 2012

(65) Prior Publication Data

US 2013/0056779 A1 Mar. 7, 2013

(30) Foreign Application Priority Data

Sep. 2, 2011 (TW) .............................. 100131841 U

(51) Int. Cl.
*H01L 33/62* (2010.01)
*H01L 33/50* (2010.01)

(52) U.S. Cl.
USPC ..................................... 257/98; 257/E33.061

(58) Field of Classification Search
None
See application file for complete search history.

(56) References Cited

U.S. PATENT DOCUMENTS

| | | | | |
|---|---|---|---|---|
| 7,737,461 | B2* | 6/2010 | Maeda et al. ................... | 257/99 |
| 8,405,114 | B2* | 3/2013 | Shen .............................. | 257/98 |
| 2004/0104398 | A1* | 6/2004 | Hon et al. ...................... | 257/98 |
| 2007/0145383 | A1* | 6/2007 | Rho et al. ...................... | 257/79 |
| 2009/0064922 | A1* | 3/2009 | Boone et al. ...................... | 117/3 |
| 2010/0038800 | A1* | 2/2010 | Yoon et al. .................... | 257/774 |
| 2010/0117102 | A1* | 5/2010 | Yoon et al. .................... | 257/89 |
| 2010/0283529 | A1* | 11/2010 | Zhang et al. ................... | 327/440 |
| 2011/0095331 | A1* | 4/2011 | Hanawa et al. ................. | 257/99 |
| 2011/0198609 | A1* | 8/2011 | Huang ............................. | 257/76 |
| 2011/0198638 | A1* | 8/2011 | Wang ............................... | 257/98 |
| 2011/0204376 | A1* | 8/2011 | Su et al. .......................... | 257/76 |
| 2012/0068207 | A1* | 3/2012 | Hata et al. ...................... | 257/94 |
| 2013/0056785 | A1* | 3/2013 | Hwang ............................. | 257/99 |
| 2013/0099265 | A1* | 4/2013 | Hwang ............................. | 257/98 |
| 2013/0099287 | A1* | 4/2013 | Moser et al. .................. | 257/197 |

OTHER PUBLICATIONS

Jung, Hyun-Min, Gi-Yeon Nam, Byung-Kyun Choi, Tae-Hee Lee, Hyun-Suk Kim, Soo-Kun Jeon, Eun-Hyun Park, and Chang-Tae Kim. "Via-hole-based Vertical GaN Light Emitting Diodes." Applied Physics Letters 91.11 (2007): 111106.*

Wei, Jingting, Baijun Zhang, Gang Wang, Bingfeng Fan, Yang Liu, Wentao Rao, Zhicong Huang, Weimin Yang, Tufu Chen, and Takashi Egawa. "Vertical GaN-Based Light-Emitting Diodes Structure on Si(111) Substrate with Through-Holes." Japanese Journal of Applied Physics 49.7 (2010): 072104.*

* cited by examiner

*Primary Examiner* — Thomas L Dickey
*Assistant Examiner* — Joseph Schoenholtz
(74) *Attorney, Agent, or Firm* — Jackson IPG PLLC

(57) ABSTRACT

An LED device includes a die carrier having a die mounting surface and electrical connection regions. An LED die is mounted on the die mounting surface of the die carrier. The LED die includes a substrate, a first type semiconductor layer disposed atop the substrate, a second type semiconductor layer disposed atop the first type semiconductor layer, an another first type semiconductor layer disposed atop the second type semiconductor layer, at least three through holes each extending from the substrate to a corresponding semiconductor layer, an insulative layer formed on inner walls of the through holes, and electrically conductive linkers mounted within the through holes. Each electrically conductive linker has an end electrically connected to a corresponding semiconductor layer and an opposite end protruding outwardly from the corresponding through hole for electrical connection to a corresponding electrical connection region. A light transmissible protective layer covers the LED die.

22 Claims, 4 Drawing Sheets

LIGHT-EMITTING DIODE DEVICES

PRIORITY CLAIM

This application claims priority to Taiwan, R.O.C. Patent Application No. 100131841 filed Sep. 2, 2011, the entirety of which is incorporated herein by reference.

BACKGROUND OF THE INVENTION

1. Field of the Invention

The present invention relates to light-emitting diode (LED) devices.

2. Description of the Prior Art

The invention is to provide a new type of light-emitting diode devices that differs from the conventional LED devices in terms of structure.

SUMMARY OF THE INVENTION

According to an aspect of the invention, a light-emitting diode (LED) device is provided, which comprises: a die carrier having a die mounting surface and a plurality of electrical connection regions electrically insulated from one another; a LED die mounted on the die mounting surface of the die carrier, wherein the LED die comprises a substrate, a first type semiconductor layer disposed atop the substrate and provided with a conductive island, a second type semiconductor layer disposed atop the first type semiconductor layer and provided with a conductive island, and an another first type semiconductor layer disposed atop the second type semiconductor layer and provided with a conductive island, each of the conductive islands of the semiconductor layers being electrically connected via a conductive wire to a corresponding one of the electrical connection regions of the die carrier; and a light transmissible protective layer formed on the die mounting surface of the die carrier in a manner covering the LED die and the conductive wires.

BRIEF DESCRIPTION OF THE DRAWINGS

The above and other objects, features and effects of the invention will become apparent with reference to the following description of the preferred embodiments taken in conjunction with the accompanying drawings, in which.

DETAILED DESCRIPTION OF THE PREFERRED EMBODIMENTS

Figure 1:
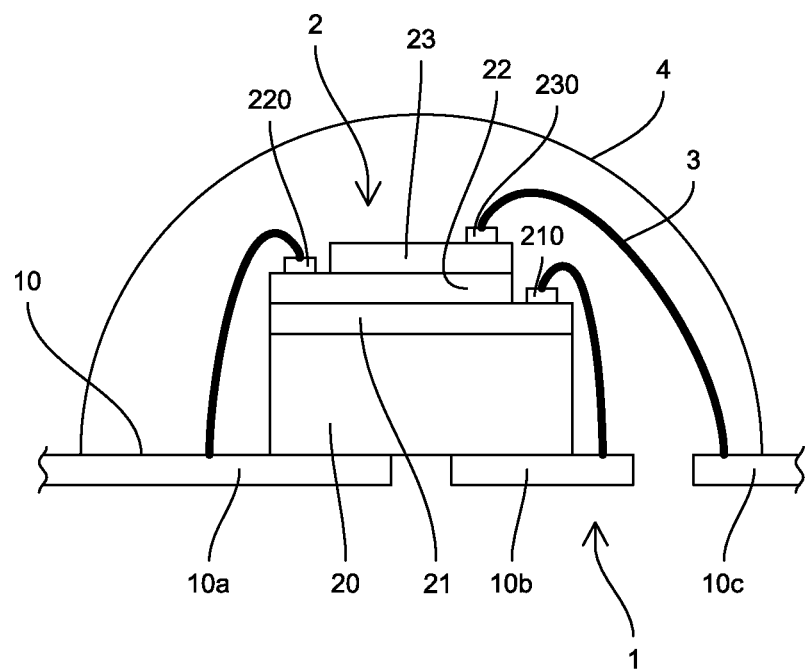
FIG. 1 is a schematic, partial cross-sectional view of the light-emitting diode device according to the first preferred embodiment of the invention.

Before the present invention is described in greater detail, it should be noted that the same or like elements are denoted by the same reference numerals throughout the disclosure. Moreover, the elements shown in the drawings are not illustrated in actual scale, but are expressly illustrated to explain in an intuitive manner the technical feature of the invention disclosed herein.

FIG. 1 is a schematic, partial cross-sectional view of the light-emitting diode device according to the first preferred embodiment of the invention.

As shown in FIG. 1, the light-emitting diode device according to the invention includes a die carrier 1 and a light-emitting diode (LED) die 2. The die carrier 1 has a die mounting surface 10 and a plurality of (such as three in this embodiment) electrical connection regions 10a, 10b, 10c electrically insulated from one another.

The LED die 2 is mounted on the die mounting surface 10 of the die carrier 1. The LED die 2 includes a substrate 20, a first type semiconductor layer 21 disposed atop the substrate 20, a second type semiconductor layer 22 disposed atop the first type semiconductor layer 21, and an another first type semiconductor layer 23 disposed atop the second type semiconductor layer 22. It should be noted that additional functional layers, such as insulation layers, may be present among the semiconductor layers 21, 22, 23. However, since these functional layers are commonly known in the art and are not critical to the invention, they are omitted in the appended drawings for brevity. The substrate 20 can be either transmissible or opaque to light, depending on the selected arrangement of a light exiting direction or the selected design for a reflective layer. In the case where the device is designed to emit light in both of the upward and downward directions, the substrate 20 is a light transmissible substrate. The substrate 20 can be a sapphire substrate or a silicon substrate.

According to this embodiment, the first type semiconductor layers 21, 23 are n-type semiconductor layers, whereas the second type semiconductor layer 22 is a p-type semiconductor layer. As an alternative, the first type semiconductor layers 21, 23 may be p-type semiconductor layers, and the second type semiconductor layer 22 may be an n-type semiconductor layer. The semiconductor layers 21, 22, 23 are provided with conductive islands 210, 220, 230, respectively. Each of the conductive islands 210, 220, 230 is electrically connected via a conductive wire 3 to a corresponding electrical connection region 10a, 10b, 10c of the die carrier 1.

The die mounting surface 10 of the die carrier 1 is provided with a light transmissible protective layer 4 which covers the LED die 2 and the conductive wires 3. The light transmissible protective layer 4 can be fully light transmissible or can be doped with phosphor powder.

Figure 2:
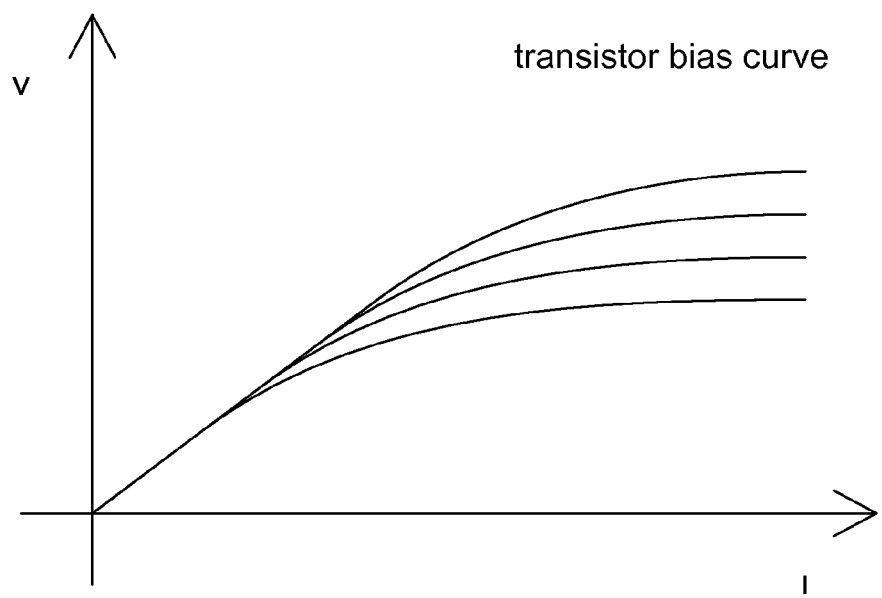
FIG. 2 shows a bias curve of a transistor.

The LED device described above exhibits a transistor amplification characteristic as denoted by the current (I) versus voltage (V) plot shown in FIG. 2, indicating that the LED device disclosed herein can amplify the current output from a small signal source and, thus, is capable of serving as a power amplifier tube.

Moreover, the P-N or N-P junction of an NPN or PNP LED chip includes a depletion region at its collector (C), base (B) terminals, where electrons and holes may combine to emit photons. The signal input into the base terminal and the load resistance at the collector terminal work together to control the magnitude of the breakdown current and the signal power amplification, thereby controlling the brightness of the LED chip. The application of a forward bias voltage and a forward bias current between the emitter (E) and base terminals further results in light emission from the PN or NP junction at the B, E terminals. As a result, the light emission due to the current amplification at both of the BC and BE provides a brightness of greater than 200 Lumen.

Since the B and C terminals of the PNP or NPN chip constitute a tunnel diode that generates a breakdown current, the PNP or NPN chip can exhibit transistor characteristics and functions.

Figure 3:
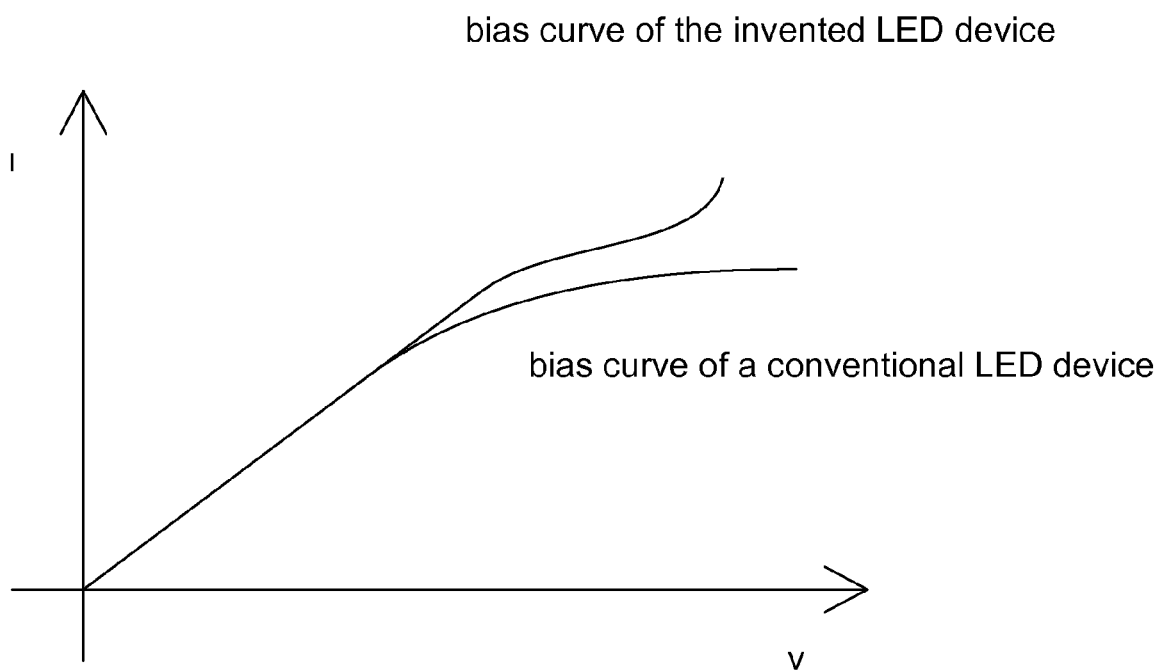
FIG. 3 shows the bias curve of the LED device according to the invention in comparison with that of a conventional LED device.

FIG. 3 shows the I versus V curve obtained by the LED device disclosed herein in comparison with that of a conventional LED device. It can conclude from the breakdown of the I versus V curve of the invented LED device that the invented LED device demonstrates a power amplification activity.

Figure 4:
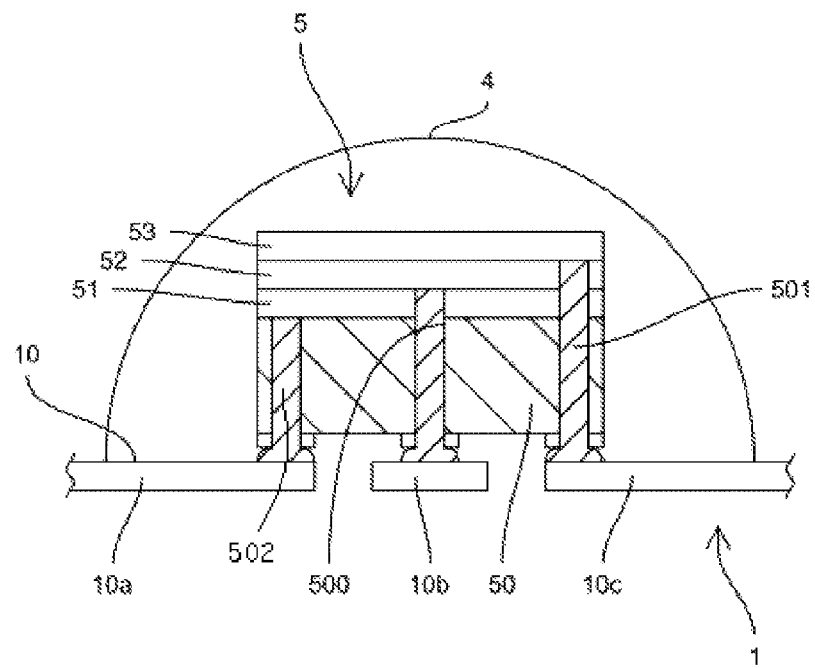
FIG. 4 is a schematic, partial cross-sectional view of the light-emitting diode device according to the second preferred embodiment of the invention.

FIG. 4 is a schematic, partial cross-sectional view of the light-emitting diode device according to the second preferred embodiment of the invention.

As shown in FIG. 4, the light-emitting diode device according to the second preferred embodiment includes a die carrier 1 and a light-emitting diode (LED) die 5. The die carrier 1 according to the second preferred embodiment, similar to its counterpart disclosed in the first preferred embodiment, has a die mounting surface 10 and a plurality of (such as three in this embodiment) electrical connection regions 10a, 10b, 10c electrically insulated from one another.

The LED die 5 is mounted on the die mounting surface 10 of the die carrier 1. The LED die 5 includes a substrate 50, a first type semiconductor layer 51 disposed atop the substrate 50, a second type semiconductor layer 52 disposed atop the first type semiconductor layer 51, and an another first type semiconductor layer 53 disposed atop the second type semiconductor layer 52. It should be noted that additional functional layers, such as insulation layers, may be present among the semiconductor layers 51, 52, 53. However, since these functional layers are commonly known in the art and are not critical to the invention, they are omitted in the appended drawings for brevity. The substrate 50 can be either transmissible or opaque to light, depending on the selected arrangement of a light exiting direction or the selected design for a reflective layer. In the case where the device is designed to emit light in both of the upward and downward directions, the substrate 50 is a light transmissible substrate. The substrate 50 can be a sapphire substrate or a silicon substrate.

The LED die 5 is formed with three through holes 500, each extending from the substrate 50 to a corresponding one of the semiconductor layers 51, 52, 53. Within each of the through holes 500, an electrically conductive linker 501 is provided in such a manner that the electrically conductive linker 501 has an end electrically connected to a corresponding one of the semiconductor layers 51, 52, 53 and an opposite end protruding outwardly from the corresponding through hole 500 and adapted for electrical connection to an external circuit (not shown). It should be noted that the through holes 500 are each coated on the inner wall thereof with an insulative layer 502, so that any of the electrically conductive linkers 501 that extend through two or more of the semiconductor layers 51, 52, 53 is prevented from establishing electrical connection between any two of the semiconductor layers 51, 52, 53.

According to this embodiment, the first type semiconductor layers 51, 53 are n-type semiconductor layers, whereas the second type semiconductor layer 52 is a p-type semiconductor layer. As an alternative, the first type semiconductor layers 51, 53 may be p-type semiconductor layers, and the second type semiconductor layer 52 may be an n-type semiconductor layer.

The die mounting surface 10 of the die carrier 1 is provided with a light transmissible protective layer 4 covering the LED die 5. The light transmissible protective layer 4 according to the second preferred embodiment, similar to its counterpart disclosed in the first preferred embodiment, can be fully transmissible to light or can be doped with phosphor powder.

Figure 5:
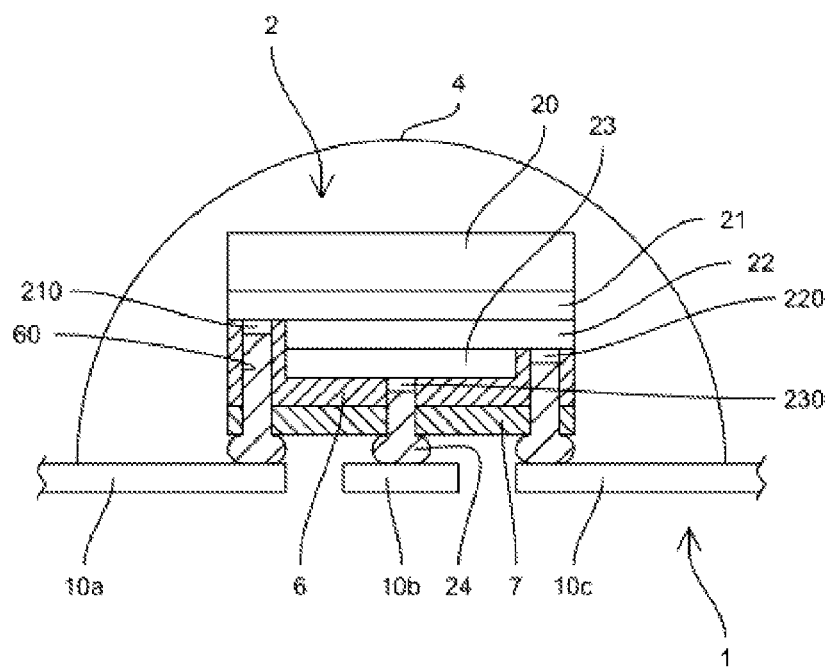
FIG. 5 is a schematic, partial cross-sectional view of the light-emitting diode device according to the third preferred embodiment of the invention.

FIG. 5 is a schematic, partial cross-sectional view of the light-emitting diode device according to the third preferred embodiment of the invention.

As shown in FIG. 5, the light-emitting diode device according to the third preferred embodiment includes a die carrier 1 and a light-emitting diode (LED) die 2. The die carrier 1 according to the third preferred embodiment, similar to its counterpart disclosed in the preferred embodiments above, has a die mounting surface 10 and a plurality of (such as three in this embodiment) electrical connection regions 10a, 10b, 10c electrically insulated from one another.

The LED die 2 includes a substrate 20, a first type semiconductor layer 21 disposed under the substrate 20 and provided with a conductive island 210, a second type semiconductor layer 22 disposed under the first type semiconductor layer 21 and provided with a conductive island 220, and an another first type semiconductor layer 23 disposed under the second type semiconductor layer 22 and provided with a conductive island 230. The conductive islands 210, 220, 230 are exposed rather than covered from the above by the semiconductor layers 22, 23. It should be noted that additional functional layers, such as insulation layers, may be present among the semiconductor layers 21, 22, 23. However, since these functional layers are not critical to the invention, they are omitted in the appended drawings for brevity.

A reflective layer 6 is disposed on surfaces of the semiconductor layers 21, 22, 23 and formed with a plurality of through holes 60 to expose the conductive islands 210, 220, 230. An insulative layer 7 is disposed under the reflective layer 6 and formed with a plurality of via holes 70 registered with the corresponding through holes 60. Within each of the through holes 70, an electrically conductive linker 24 is provided in such a manner that the electrically conductive linker 24 has an end electrically connected to a corresponding one of the conductive islands 210, 220, 230 and an opposite end protruding outwardly from the corresponding through hole 70.

It should be noted that the substrate 20 according to the third preferred embodiment is a light transmissible substrate.

According to this embodiment, the first type semiconductor layers 21, 23 are n-type semiconductor layers, whereas the second type semiconductor layer 22 is a p-type semiconductor layer. As an alternative, the first type semiconductor layers 21, 23 may be p-type semiconductor layers, and the second type semiconductor layer 22 may be an n-type semiconductor layer. Each of the conductive islands 210, 220, 230 is electrically connected via an electrically conductive linker 24 to a corresponding electrical connection region 10a, 10b, 10c of the die carrier 1.

The die mounting surface 10 of the die carrier 1 is provided with a light transmissible protective layer 4 covering the LED die 2. The light transmissible protective layer 4 according to the third preferred embodiment, similar to its counterpart disclosed in the first preferred embodiment, can be fully transmissible to light or can be doped with phosphor powder.

Figure 6:
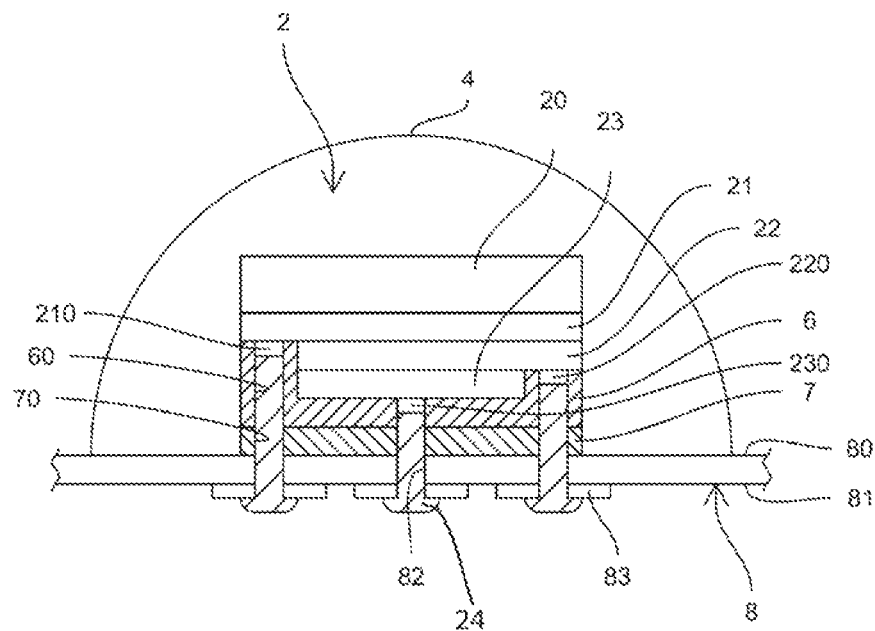
FIG. 6 is a schematic, partial cross-sectional view of the light-emitting diode device according to the fourth preferred embodiment of the invention.

FIG. 6 is a schematic, partial cross-sectional view of the light-emitting diode device according to the fourth preferred embodiment of the invention.

As shown in FIG. 6, the light-emitting diode device according to the fourth preferred embodiment includes a die carrier 8 and a light-emitting diode (LED) die 2.

The LED die 2 includes a substrate 20, a first type semiconductor layer 21 disposed under the substrate 20 and provided with a conductive island 210 at a predetermined position, a second type semiconductor layer 22 disposed under the first type semiconductor layer 21 and provided with a conductive island 220 at a predetermined position, and an another first type semiconductor layer 23 disposed under the second type semiconductor layer 22 and provided with a conductive island 230 at a predetermined position. The conductive islands 210, 220, 230 are exposed rather than covered from the above by the semiconductor layers 22, 23. It should be noted that additional functional layers, such as insulation layers, may be present among the semiconductor layers 21, 22, 23. However, since these functional layers are not critical to the invention, they are omitted in the appended drawings for brevity.

A reflective layer 6 is disposed under surfaces of the semiconductor layers 21, 22, 23 and formed with a plurality of through holes 60 to expose the contact pads 210, 220, 230. An insulative layer 7 with adhesive property is disposed on the reflective layer 6 and formed with a plurality of via holes 70 registered with the corresponding through holes 60.

It should be noted that the substrate 20 according to the fourth preferred embodiment is a light transmissible substrate.

According to this embodiment, the first type semiconductor layers 21, 23 are n-type semiconductor layers, whereas the second type semiconductor layer 22 is a p-type semiconductor layer. As an alternative, the first type semiconductor layers 21, 23 may be p-type semiconductor layers, and the second type semiconductor layer 22 may be an n-type semiconductor layer.

According to this embodiment, the die carrier 8 is a diamond substrate having a first surface 80, a second surface 81 opposite to the first surface 80, a plurality of vias 82 connecting the first surface 80 to the second surface 81, and a plurality of anchor seats 83 formed on the second surface 81 of the die carrier 8 along peripheries of the respective vias 82. Taking advantage of the adhesive property of the insulative layer 7, the LED die 2 is mounted on the first surface 80 of the die carrier 8, with the vias 82 of the die carrier 8 being registered with the corresponding via holes 70 of the insulative layer 7. A plurality of electrically conductive linkers 9 are provided, each extending from a corresponding one of the conductive islands 210, 220, 230 to a corresponding one of the anchor seats 83 through a corresponding through hole 60, a corresponding via hole 70 and a corresponding via 82.

The first surface 80 of the die carrier 8 is provided with a light transmissible protective layer 4 covering the LED die 2. The light transmissible protective layer 4 according to the fourth preferred embodiment, similar to its counterpart disclosed in the preferred embodiments above, can be fully transmissible to light or can be doped with phosphor powder.

Figure 7:
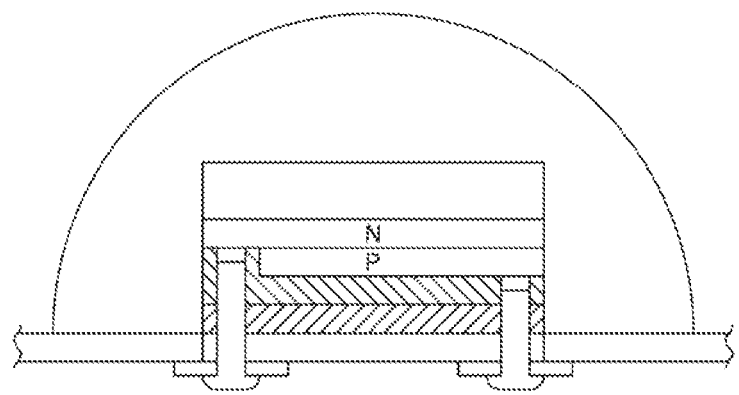
FIG. 7 is a schematic, partial cross-sectional view of the light-emitting diode device according to the fifth preferred embodiment of the invention.

FIG. 7 is a schematic, partial cross-sectional view of the light-emitting diode device according to the fifth preferred embodiment of the invention.

The LED device according to the fifth preferred embodiment differs from that disclosed in the fourth preferred embodiment in that the LED die 2 includes only a first type semiconductor layer 21 disposed atop the substrate 20 and a second type semiconductor layer 22 disposed atop the first type semiconductor layer 21.

What is claimed is:

1. A light-emitting diode device, comprising:
a die carrier having a die mounting surface and a plurality of electrical connection regions electrically insulated from one another;
a light-emitting diode (LED) die mounted on the die mounting surface of the die carrier, wherein the LED die comprises a substrate, a first type semiconductor layer disposed atop the substrate, a second type semiconductor layer disposed atop the first type semiconductor layer, an another first type semiconductor layer disposed atop the second type semiconductor layer, at least three through holes each extending through the substrate to a corresponding one of the semiconductor layers, an insulative layer formed on inner walls of the through holes, and electrically conductive linkers mounted within the respective through holes, and
wherein each of the electrically conductive linkers has an end electrically connected to a corresponding one of the semiconductor layers and an opposite end protruding outwardly from the corresponding through hole and adapted for electrical connection to a corresponding one of the electrical connection regions of the die carrier; and
a light transmissible protective layer formed on the die mounting surface of the die carrier in a manner covering the LED die.

2. The LED device according to claim 1,
wherein the light transmissible protective layer is doped with phosphor powder.

3. The LED device according to claim 1,
wherein the first type semiconductor layers are p-type semiconductor layers, whereas the second type semiconductor layer is an n-type semiconductor layer.

4. The LED device according to claim 1,
wherein the first type semiconductor layers are n-type semiconductor layers, whereas the second type semiconductor layer is a p-type semiconductor layer.

5. The LED device according to claim 1,
wherein the electrically conductive linkers are made of indium tin oxide (ITO).

6. The LED device according to claim 1,
wherein the electrically conductive linkers are made of any electrically conductive metallic material.

7. The LED device according to claim 1,
wherein the substrate is a sapphire substrate or a silicon substrate.

8. A light-emitting diode device, comprising:
a die carrier having a die mounting surface and a plurality of electrical connection regions electrically insulated from one another;
a light-emitting diode (LED) die mounted on the die mounting surface of the die carrier, wherein the LED die comprises a substrate, a first type semiconductor layer disposed under the substrate and provided with a conductive island, a second type semiconductor layer disposed under the first type semiconductor layer without shielding the conductive island of the first type semiconductor layer and provided with a conductive island, and an another first type semiconductor layer disposed under the second type semiconductor layer without shielding the conductive island of the second type semiconductor layer and provided with a conductive island;
a reflective layer disposed under the semiconductor layers and formed with a plurality of through holes to expose the conductive islands;
an insulative layer disposed under the reflective layer and formed with a plurality of via holes registered with the corresponding through holes;
a plurality of electrically conductive linkers, each extending from a corresponding one of the conductive islands along a corresponding one of the through holes and the via hole registered with the corresponding through hole and protruding outwardly from the insulative layer for electrical connection to a corresponding one of the electrical connection regions of the die carrier; and a light transmissible protective layer formed on the die mounting surface of the die carrier in a manner covering the LED die.

9. The LED device according to claim 8,
wherein the light transmissible protective layer is doped with phosphor powder.

10. The LED device according to claim 8,
wherein the first type semiconductor layers are p-type semiconductor layers, whereas the second type semiconductor layer is an n-type semiconductor layer.

11. The LED device according to claim 8,
wherein the first type semiconductor layers are n-type semiconductor layers, whereas the second type semiconductor layer is a p-type semiconductor layer.

12. The LED device according to claim 8,
wherein the electrically conductive linkers are made of indium tin oxide (ITO).

13. The LED device according to claim 8,
wherein the electrically conductive linkers are made of any electrically conductive metallic material.

14. The LED device according to claim 8,
wherein the substrate is a sapphire substrate or a silicon substrate.

15. A light-emitting diode device, comprising:
a the die carrier comprising a first surface, a second surface opposite to the first surface, a plurality of vias connecting the first surface to the second surface, and a plurality of anchor seats formed on the second surface of the die carrier along peripheries of the respective vias;
a light-emitting diode (LED) die comprising a substrate, a first type semiconductor layer disposed under the substrate and provided with a conductive island at a predetermined position, a second type semiconductor layer disposed under the first type semiconductor layer without shielding the conductive island of the first type semiconductor layer and provided with a conductive island at a predetermined position;
a reflective layer disposed under surfaces of the semiconductor layers and formed with a plurality of through holes to expose the conductive islands;
an adhesive insulative layer disposed on the reflective layer and formed with a plurality of via holes registered with the corresponding through holes;
a plurality of electrically conductive linkers, each extending from a corresponding one of the conductive islands to a corresponding one of the anchor seats along a corresponding one of the through holes, a corresponding one of the via holes and a corresponding one of the vias; and
a light transmissible protective layer formed on the first surface of the die carrier in a manner covering the LED die.

16. The LED device according to claim 15,
further comprising an additional first type semiconductor layer disposed atop the second type semiconductor layer without shielding the conductive island of the second type semiconductor layer and provided with a conductive island at a predetermined position.

17. The LED device according to claim 15,
wherein the light transmissible protective layer is doped with phosphor powder.

18. The LED device according to claim 16,
wherein the first type semiconductor layers are p-type semiconductor layers, whereas the second type semiconductor layer is an n-type semiconductor layer.

19. The LED device according to claim 16,
wherein the first type semiconductor layers are n-type semiconductor layers, whereas the second type semiconductor layer is a p-type semiconductor layer.

20. The LED device according to claim 15,
wherein the electrically conductive linkers are made of indium tin oxide (ITO).

21. The LED device according to claim 15,
wherein the electrically conductive linkers are made of any electrically conductive metallic material.

22. The LED device according to claim 15,
wherein the substrate is a sapphire substrate or a silicon substrate.

\* \* \* \* \*